(12) United States Patent
Sakima et al.

(10) Patent No.: US 9,499,156 B2
(45) Date of Patent: Nov. 22, 2016

(54) ON-BOARD APPARATUS (71) Applicants: DENSO CORPORATION, Kariya, Aichi-pref. (JP); Nippon Soken, Inc., Nishio, Aichi-pref. (JP)

(72) Inventors: Taku Sakima, Chiryu (JP); Yoshihisa Ogata, Chiryu (JP)

(73) Assignees: DENSO CORPORATION, Kariya, Aichi-pref. (JP); NIPPON SOKEN, INC., Nishio, Aichi-pref. (JP)

( * ) Notice: Subject to any disclaimer, the term of this patent is extended or adjusted under 35 U.S.C. 154(b) by 239 days.

(21) Appl. No.: 14/225,827

(22) Filed: Mar. 26, 2014

(65) Prior Publication Data
US 2014/0297134 A1    Oct. 2, 2014

(30) Foreign Application Priority Data

Mar. 27, 2013 (JP) ................. 2013-066724

(51) Int. Cl.
*B60W 10/18*    (2012.01)
*B60W 10/20*    (2006.01)
*B60W 50/00*    (2006.01)
(Continued)

(52) U.S. Cl.
CPC ............ *B60W 10/20* (2013.01); *B60W 10/184* (2013.01); *B60W 30/09* (2013.01); *B60W 30/095* (2013.01); *B60W 50/0097* (2013.01); *B60W 2050/0042* (2013.01); *B60W 2050/0056* (2013.01); *B60W 2520/14* (2013.01); *B60W 2540/18* (2013.01); *B60W 2550/146* (2013.01); *H03H 2210/012* (2013.01); *Y02T 10/84* (2013.01)

(58) Field of Classification Search
CPC .......................... B60W 30/09; B60W 50/0097
See application file for complete search history.

(56) References Cited

U.S. PATENT DOCUMENTS

2005/0228580 A1    10/2005  Winner et al.
2005/0288834 A1*   12/2005  Heiniger ............... G05D 1/027
                                                 701/23

(Continued)

FOREIGN PATENT DOCUMENTS

JP    07-081603      3/1995
JP    2001-322448    11/2001

(Continued)

OTHER PUBLICATIONS

Office Action dated May 19, 2015 in corresponding Japanese Application No. 2013-066724.

(Continued)

*Primary Examiner* — Thomas G Black
*Assistant Examiner* — Peter D Nolan
(74) *Attorney, Agent, or Firm* — Harness, Dickey & Pierce, P.L.C.

(57) ABSTRACT

An on-board apparatus includes a measuring unit, a filtering unit, a predicting unit, an executing unit, a detecting unit, and an adjusting unit. The measuring unit periodically measures a state of an own vehicle. The filtering unit performs a low-pass filter process on measurement results from the measuring unit. The predicting unit predicts behavior of the own vehicle based on the measurement results on which the low-pass filter process has been performed. The executing unit performs processes based on the behavior of the own vehicle predicted by the predicting unit. The detecting unit detects a traveling environment of the own vehicle. The adjusting unit adjusts a time constant for the low-pass filter process based on the traveling environment detected by the detecting unit.

6 Claims, 3 Drawing Sheets (51) Int. Cl.
*B60W 10/184* (2012.01)
*B60W 30/09* (2012.01)
*B60W 30/095* (2012.01)

(56) References Cited

U.S. PATENT DOCUMENTS

| | | | | |
|---|---|---|---|---|
| 2009/0164080 | A1* | 6/2009 | Kurata | B60K 31/0008 701/70 |
| 2010/0106378 | A1* | 4/2010 | O'Dea | G05D 1/0891 701/48 |
| 2011/0295548 | A1* | 12/2011 | Takabayashi | G06K 9/00798 702/142 |
| 2013/0231825 | A1* | 9/2013 | Chundrlik, Jr. | B60W 50/0098 701/29.1 |

FOREIGN PATENT DOCUMENTS

| | | |
|---|---|---|
| JP | 2005-088806 | 4/2005 |
| JP | 2005-524166 | 8/2005 |
| JP | 2007-008281 | 1/2007 |
| JP | 2007-223550 | 9/2007 |
| JP | 2009-009209 | 1/2009 |
| JP | 2009-211497 | 9/2009 |
| JP | 2010120583 A * | 6/2010 |

OTHER PUBLICATIONS

Office Action dated May 27, 2014 in corresponding Korean Application No. 10-2014-0030703.
Office Action dated May 27, 2015 in corresponding Korean Application No. 10-2014-0030703.

* cited by examiner

ON-BOARD APPARATUS

CROSS-REFERENCE TO RELATED APPLICATION

This application is based on and claims the benefit of priority from Japanese Patent Application No. 2013-066724, filed Mar. 27, 2013, the disclosure of which is incorporated herein in its entirety by reference.

BACKGROUND

Technical Field

The present invention relates to an on-board apparatus, and in particular, to an on-board apparatus that predicts behavior of an own vehicle and performs processes based on prediction results.

Related Art

Conventionally, an on-board apparatus is known that predicts the course of an own vehicle based on yaw rate and steering angle. In addition, the on-board apparatus detects targets, such as pedestrians and other vehicles, using radar or a camera. For example, when a target is present on the predicted course of the own vehicle, the on-board apparatus issues a warning, intervenes in driving operations, and the like to avoid collision with the target.

An example of an apparatus such as this is an image recognition apparatus described in JP-A-2009-9209. The image recognition apparatus estimates a future positional relationship between the own vehicle and a target based on yaw rate, vehicle speed, and the like. Based on the estimated positional relationship, the image recognition apparatus estimates a future display area of the target in an image captured by a camera. The image recognition apparatus then performs image recognition on the display area, and performs enhanced display of the target or the like. The image recognition apparatus thereby issues a warning for collision avoidance while reducing processing load for target recognition.

In some instances, the yaw rate and the like significantly fluctuate instantaneously as a result of drifting of the steering wheel, noise, and the like. When the course is predicted based on yaw rate and the like, if such fluctuations are directly reflected in the course prediction, the accuracy of course prediction decreases. Appropriate driving assistance cannot be provided. Therefore, the above-described on-board apparatus is generally configured such as to perform a low-pass filter process on measurement values of the yaw rate and the like. As a result, the effects of sudden fluctuations in the yaw rate and the like can be suppressed. The course can be accurately predicted even when drifting of the steering wheel and the like occur.

However, when the low-pass filter process is performed, a time lag occurs until the changes in yaw rate and the like attributed to steering wheel operation are reflected in the course prediction. Therefore, for example, in situations where the curvature of the road suddenly changes, such as near an entrance to a curve, an accurate course prediction cannot be performed. A problem occurs in that appropriate driving assistance cannot be provided.

SUMMARY

It is thus desired to provide an on-board apparatus that is capable of more appropriately predicting behavior of an own vehicle.

An exemplary embodiment provides an on-board device including: measuring means for periodically measuring the state of an own vehicle; filtering means for performing a low-pass filter process on the measurement results from the measuring means; predicting means for predicting the behavior of the own vehicle based on the measurement results on which the low-pass filter process has been performed; executing means for performing processes based on the behavior of the own vehicle predicted by the predicting means; detecting means for detecting a traveling environment of the own vehicle; and adjusting means for adjusting a time constant for the low-pass filter process based on the traveling environment detected by the detecting means.

According to this configuration, the low-pass filter process is performed on the measurement results of the state of the own vehicle. Therefore, for example, even when the state of the own vehicle suddenly changes as a result of drifting of the steering wheel, noise, and the like, a decrease in prediction accuracy of the behavior of the own vehicle can be prevented.

However, as a result of the low-pass filter process being performed, a time lag occurs until the changes in the state of the own vehicle caused by driving operations and the like are reflected in the prediction of the behavior of the own vehicle. Therefore, the prediction accuracy decreases.

In this regard, according to the above-described configuration, the time constant for the low-pass filter process can be set to an optimal value based on the traveling environment of the own vehicle.

Specifically, for example, in an instance in which the behavior of the own vehicle is expected to change little based on the detection results of the traveling environment, the time constant may be set to a high value. The behavior of the own vehicle may be predicted in a state in which the effects of drifting of the steering wheel and the like are eliminated as much as possible.

As a result, although the time lag until the changes in the state of the own vehicle caused by driving operations, traveling environment, and the like are reflected in the prediction of the behavior of the own vehicle becomes longer, the effects of reduced prediction accuracy is minimal because the behavior of the own vehicle changes little. Therefore, by increasing the degree of elimination of the effects of drifting of the steering wheel and the like, the behavior of the own vehicle can be appropriately predicted.

In addition, for example, even in instances in which a judgment is made, from the detection results of the traveling environment, that a process performed based on the prediction results of the behavior of the own vehicle does not require high accuracy, the time constant may be set to a high value.

In such instances as well, the effects caused by decrease in prediction accuracy are minimal. By increasing the degree of elimination of the effects of drifting of the steering wheel and the like, the behavior of the own vehicle can be appropriately predicted.

On the other hand, for example, in instances in which the behavior of the own vehicle is expected to change based on the detection results of the traveling environment, or when judged that a process performed based on the prediction results of the behavior of the own vehicle requires high accuracy, the time constant may be set to a low value.

As a result, the time lag until the changes in the state of the own vehicle attributed to driving operations and the like are reflected in the prediction of the behavior of the own vehicle becomes shorter. Prediction accuracy can be improved.

According to the exemplary embodiment, the time constant for the low-pass filter process can be adjusted to an optimal value based on the traveling environment of the own vehicle. Therefore, the behavior of the own vehicle can be more appropriately predicted.

In the exemplary embodiment, the measuring means may measure at least one of either the yaw rate and the steering angle of the own vehicle as the state of the own vehicle. The predicting means may predict the course of the own vehicle as the behavior of the own vehicle. The detecting means may detect the degree of curving of an expected traveling road on which the own vehicle is predicted to travel as the traveling environment.

According to this configuration, for example, in instances in which the course of the own vehicle is expected to change little, such as when the own vehicle is continuously traveling on a straight road, the time constant can be set to a higher value. The course can be predicted in a state in which the effects of drifting of the steering wheel and the like are eliminated as much as possible.

As a result, the time lag until the steering wheel operation and the like are reflected in the course prediction becomes longer. The accuracy of course prediction decreases. However, because the course of the own vehicle changes little, the effects are minimal. Therefore, as a result of the degree of elimination of the effects of drifting of the steering wheel and the like being increased, the course of the own vehicle can be appropriately predicted.

On the other hand, for example, in instances in which the course of the own vehicle is expected to change, such as when the own vehicle enters a curve, the time constant can be set to a lower value. As a result, the time lag until the steering wheel operation and the like are reflected in the results of course prediction becomes shorter. The accuracy of course prediction can be improved.

As a result, the time constant for the low-pass filter process can be adjusted to an optimal value based on the degree of curving of the expected traveling road of the own vehicle. Therefore, the course of the own vehicle can be more appropriately predicted.

DESCRIPTION OF THE EMBODIMENTS

An embodiment of the present invention will hereinafter be described with reference to the drawings. Embodiments of the present invention are not in any way limited by the embodiment described hereafter. Various modifications may be made so long as the modifications fall within the technical scope of the present invention.

Figure 1:
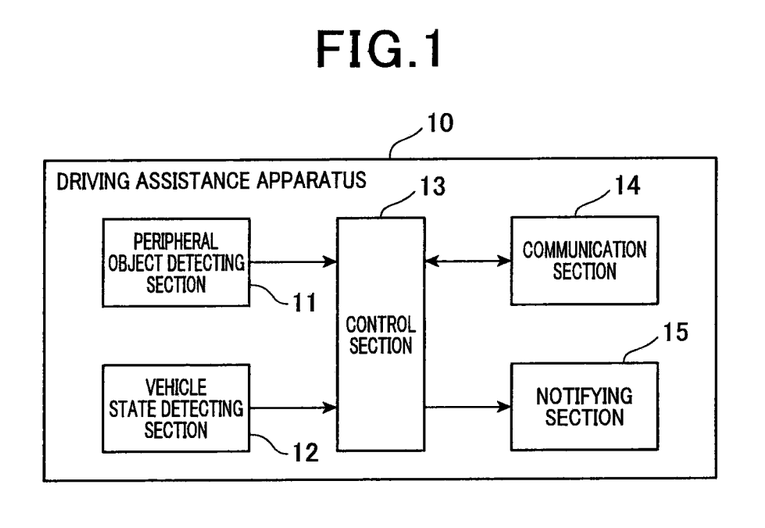
FIG. 1 is a block diagram of a configuration of a driving assistance apparatus applied to an on-board apparatus according to an embodiment.

As shown in FIG. 1, a driving assistance apparatus 10 according to the present embodiment is applicable to an on-board apparatus that is mounted in an own vehicle. The driving assistance apparatus 10 judges the risk of collision between the own vehicle and a target. The target is, for example, another vehicle or a pedestrian. When judged that the risk of collision with the target reaches a certain level, the driving assistance apparatus 10 performs driving assistance, such as issuing a warning or stopping the own vehicle. As shown in FIG. 1, the driving assistance apparatus 10 includes a peripheral object detecting section 11, a vehicle state detecting section 12, a control section 13, a communication section 14, and a notifying section 15.

The peripheral object detecting section 11 is configured by a camera, a radar, or the like. The camera captures an image of an area ahead of the own vehicle. The radar transmits radio waves, such as microwaves or millimeter waves, ahead of the own vehicle and receives reflected waves thereof. The peripheral object detecting section 11 detects the position, size, shape, and the like of an object present ahead of or near the own vehicle. The peripheral object detecting section 11 may be configured by both the camera and the radar. Alternatively, the peripheral object detecting section 11 may be configured by either the camera or the radar. This peripheral object detecting section 11 is equivalent to a detecting unit or a detector for detecting a peripheral object.

The vehicle state detecting section 12 detects at least one of a yaw rate and a steering angle of the own vehicle (referred to, hereinafter, as simply yaw rate and the like). The vehicle state detecting section 12 also detects vehicle speed. The vehicle state detecting section 12 is configured by a yaw rate sensor, a steering angle sensor, a vehicle speed sensor, and the like. The vehicle state detecting section 12 may be configured such as to acquire the yaw rate, steering angle, and vehicle speed detected by another electronic control unit (ECU) over an in-vehicle local area network (LAN) or the like. This vehicle state detecting section 12 is equivalent to a detecting unit or a detector for detecting a vehicle state.

The control section 13 includes a central processing unit (CPU), a read-only memory (ROM), a random access memory (RAM), and an input/output (I/O). The control section 13 performs integrated control of the driving assistance apparatus 10. The control section 13 is equivalent to a control unit or a controller.

The communication section 14 communicates with other ECUs over the in-vehicle LAN or the like. This communication section 14 is equivalent to a communication unit.

The notifying section 15 issues various warnings for driving assistance. The notifying section 15 is configured by a display device, a speaker, or the like.

(1) Overview

First, an overview of operations performed by the driving assistance apparatus 10 will be described.

The driving assistance apparatus 10 uses the peripheral object detecting section 11 to detect the position, size, shape, and the like of a target present on an expected traveling road of the own vehicle or near the own vehicle. The expected traveling road refers to the road ahead of the own vehicle on which the own vehicle is predicted to travel. The target is a pedestrian, another vehicle, a foreign object, or the like. In addition, the driving assistance apparatus 10 may also calculate movement direction, movement speed, and the like of the target based on history information, such as positions.

The driving assistance apparatus 10 periodically measures the yaw rate and the like, and the vehicle speed using the vehicle state detecting section 12. Based on the measured yaw rate and the like, and the vehicle speed, the driving assistance apparatus 10 predicts the course of the own vehicle. Then, the driving assistance apparatus 10 judges the risk of collision between the own vehicle and the target based on the predicted course, the position of the target, and the like. When judged that the risk of collision has reached a certain level, the driving assistance apparatus 10 starts driving assistance.

In addition, the driving assistance apparatus 10 performs a low-pass filter process on the measurement values of the yaw rate and the like. As a result, the driving assistance apparatus 10 can suppress the effects of sudden fluctuations in the yaw rate and the like. The driving assistance apparatus 10 can accurately predict the course even when drifting of the steering wheel and the like occur.

However, as a result of the low-pass filter process being performed, a time lag occurs until the changes in yaw rate and the like attributed to steering wheel operation and the like are reflected in the course prediction. Therefore, for example, when a vehicle is traveling on a curve, in situations where the curvature of the road suddenly changes, such as near an entrance to a curve, an accurate course prediction cannot be performed. A situation occurs in which an accurate course prediction is possible after the vehicle has passed entrance area and steering wheel operation has stabilized.

The driving assistance apparatus 10 according to the present embodiment uses the peripheral object detecting section 11 to measure the curvature of the expected traveling road. In addition, the driving assistance apparatus 10 adjusts a time constant for the low-pass filter process based on the measured curvature. As a result, the time constant for the low-pass filter process can be set to an optimal value based on the curvature of the expected traveling road. The driving assistance apparatus 10 can perform a more appropriate course prediction.

A process performed when driving assistance is started and a process for adjusting the time constant will hereinafter be described in detail.

(2) Driving Assistance Starting Process

Figure 2:
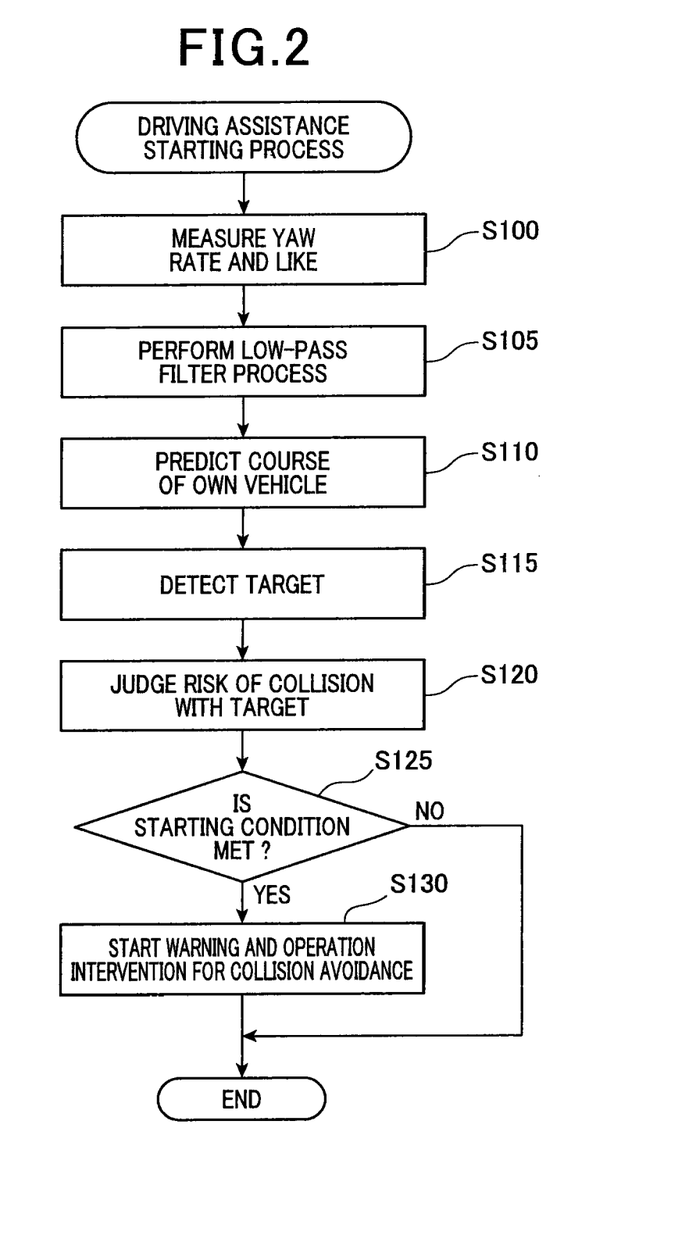
FIG. 2 is a flowchart of a driving assistance starting process performed by the driving assistance apparatus shown in FIG. 1.

First, a driving assistance starting process will be described with reference to the flowchart in FIG. 2. The driving assistance starting process starts driving assistance based on the risk of collision with the target. The driving assistance starting process is periodically performed by the control section 13 of the driving assistance apparatus 10. A program for the driving assistance starting process corresponding to the flowchart shown in FIG. 2 is stored in advance in a memory, such as the ROM within the control section 13. The CPU within the control section 13 runs the program.

At step S100, the control section 13 uses the vehicle state detecting section 12 to measure the yaw rate and the like, and the vehicle speed. The control section 13 then proceeds to step S105. At step S105, the control section 13 performs the low-pass filter process on the measurement results of the yaw rate and the like. The control section 13 then proceeds to step S110.

At step S110, the control section 13 predicts the course of the own vehicle based on the measurement results of the yaw rate and the like on which the low-pass filter process has been performed, and the measurement result of the vehicle speed. The control section 13 then proceeds to step S115. At step S115, the control section 13 uses the peripheral object detecting section 11 to detect the position, size, shape, and the like of a target present ahead of or near the own vehicle. The control section 13 then proceeds to step S120.

At step S120, the control section 13 judges the risk of collision with the target based on the predicted course of the own vehicle, and the position, size and the like of the target. At subsequent step S125, the control section 13 judges whether or not the risk of collision with the target has reached a certain level and a condition for starting driving assistance is met.

Specifically, for example, the control section 13 may estimate a predicted collision position or a predicted collision timing between the own vehicle and the target based on the predicted course and vehicle speed of the own vehicle, and the position, size, movement direction, movement speed, and the like of the target. In addition, the control section 12 may calculate the remaining distance to the predicted collision position, or the remaining time until the predicted collision timing. Then, when judged that these values are a threshold or lower, the control section 13 may judge that the risk of collision has reached a certain level and considers the starting condition to be met.

In addition, for example, the control section 13 may estimate a lateral direction distance between the own vehicle and the target at the predicted collision position, based on the lateral width of the own vehicle, the position of a side portion of the target (lateral position), and the like. Then, when judged that the estimation value is a threshold or lower, the control section 13 may judge that the risk of collision has reached a certain level and the starting condition has been met.

Then, when judged that the starting condition is met (YES at step S125), the control section 13 proceeds to step S130. When judged that the starting condition is not met (NO at step S125), the control section 13 ends the driving assistance starting process.

At step S130, the control section 13 performs a process for performing driving assistance and ends the driving assistance starting process. Specifically, for example, the control section 13 may use the notifying section 15 to issue an alarm sound or display a warning message indicating that the risk of collision is high. The control section 13 may, of course, communicate with another ECU using the communication section 14, and output an alarm sound or a warning message through the ECU.

In addition, the control section 13 may communicate with another ECU using the communication section 14, operate the brakes, and stop the own vehicle. Alternatively, the control section 13 may perform steering assistance and change the course of the own vehicle to avoid collision with the target.

(3) Time Constant Adjusting Process

Figure 3:
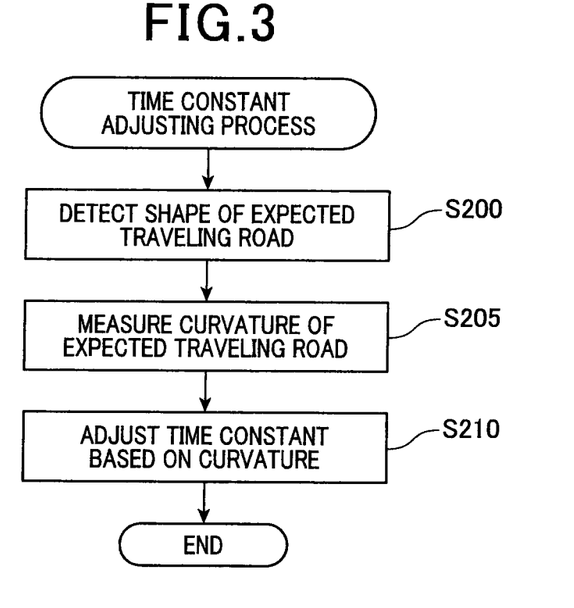
FIG. 3 is a flowchart of a time constant adjusting process performed by the driving assistance apparatus shown in FIG. 1.

Next, a time constant adjusting process will be described with reference to the flowchart in FIG. 3. The time constant adjusting process is performed to adjust the time constant for the low-pass filter process. The time constant adjusting process is periodically performed by the control section 13 of the driving assistance apparatus 10. A program for the time constant adjusting process corresponding to the flowchart shown in FIG. 3 is stored in advance in a memory, such as the ROM within the control section 13. The CPU within the control section 13 runs the program.

At step S200, the control section 13 sets, as the expected traveling road, a road of a predetermined length that extends ahead of the own vehicle with the own vehicle as the starting point. In addition, the control section 13 uses the peripheral object detecting section 11 to detect the shape of the expected traveling road. The control section 13 then proceeds to step S205.

Specifically, when the peripheral object detecting section 11 is configured by a camera, the control section 13 may detect the shape of the expected traveling road by performing, for example, lane recognition using images captured by the camera. In addition, when the peripheral object detecting section 11 is configured by a radar, the control section 13 may detect the shape of the expected traveling road based on the position, shape, and the like of the object detected by the radar.

At step S205, the control section 13 determines a plurality of curvature determining points at a fixed interval from the current location of the own vehicle to the end of the expected traveling road. In addition, the control section 13 measures the curvature (or a radius of curvature) at each curvature determining point. The control section 13 then proceeds to step S210.

At step S210, the control section 13 adjusts the time constant for the low-pass filter process based on the measurement result of the curvature of the expected traveling road. The control section 13 then ends the time constant adjusting process.

Specifically, for example, the control section 13 may adjust the time constant between two levels, depending on whether or not the maximum value of the curvatures at the curvature determining points, an average value of the curvatures, or the like reaches a predetermined threshold (in other words, whether or not the expected traveling road is a curve having a certain degree of curving or more). In such instances, the time constant may be set to a low value when the maximum value of curvatures or the like is the threshold or more. The time constant may be set to a high value when the maximum value of curvatures or the like is less than the threshold.

As a result, in instances in which the course of the own vehicle changes, such as when the own vehicle is entering a curve, the time constant becomes low. Therefore, the time lag until steering wheel operation and the like are reflected in the course prediction becomes short. The accuracy of course prediction is improved. As a result, a more appropriate driving assistance can be performed.

On the other hand, in instances in which the course of the own vehicle changes little, such as when the own vehicle is traveling on a straight road or the like, the time constant becomes high. Therefore, the course can be predicted in a state in which the effects of drifting of the steering wheel and the like are eliminated as much as possible.

As a result, although the time lag until steering wheel operation and the like are reflected in the course prediction becomes longer, driving assistance is minimally affected because the course of the own vehicle changes little. Therefore, by increasing the degree by which the effects of drifting of the steering wheel and the like are eliminated, a more appropriate course prediction can be performed. As a result, driving assistance can be appropriately performed.

In addition, for example, the control section 13 may adjust the time constant between three or more levels, depending on the maximum value of curvature and the like. The time constant may be set to a lower value as the maximum value of curvatures or the like increases. The time constant may be set to a higher value as the maximum value of curvatures or the like decreases.

As a result, the time constant can be adjusted depending on the degree of curving of the expected traveling road. Therefore, the time constant for the low-pass filter process can be set to an optimal value with high accuracy. A more appropriate course prediction can be performed.

In addition, for example, the control section 13 may calculate the difference between the maximum value and the minimum value of curvatures at the curvature determining points, a standard deviation of the curvatures, or the like as the degree of change in curvature of the expected traveling road. The control section 13 may then adjust the time constant based on the degree of change in curvature.

Specifically, the control section 13 may adjust the time constant between two levels, depending on whether or not the degree of change in curvature reaches a predetermined threshold. In such instances, the time constant may be set to a low value when the degree of change in curvature reaches the predetermined threshold. The time constant may be set to a high value when the degree of change in curvature does not reach the predetermined threshold.

In addition, for example, the control section 13 may adjust the time constant between three or more levels depending on the degree of change in curvature. The time constant may be set to a lower value as the degree of change in curvature increases. The time constant may be set to a higher value as the degree of change in curvature decreases.

In such instances as well, the time constant for the low-pass filter process can be set to an optimal value depending on the degree of curving of the expected traveling road. A more appropriate course prediction can be performed.

Other Embodiments (1) In the time constant adjusting process according to the present embodiment, the control section 13 measures the curvature of the expected traveling road using the peripheral object detecting section 11 that is composed of a camera or a radar. However, for example, the control section 13 may recognize the shape of the expected traveling road from map data provided in a navigation apparatus or the like. The control section 13 may calculate the curvature using the shape of the expected traveling road. In such instances as well, similar effects can be achieved.

(2) In addition, in the time constant adjusting process according to the present embodiment, the control section 13 adjusts the time constant for the low-pass filter process based on the curvature of the expected traveling road.

However, in addition, the control section 13 may set the time constant to a low value when a target, such as another vehicle or a pedestrian, is present near the own vehicle. The control section 13 may set the time constant to a high value when a target is not present near the own vehicle.

As a result, when the risk of collision between the own vehicle and the target is low, and the effect of a less accurate driving assistance is minimal, the course prediction is performed in a state in which the degree of elimination of the effects of drifting of the steering wheel and the like is increased.

On the other hand, when the risk of collision between the own vehicle and the target is high, the accuracy of course prediction can be increased. As a result, driving assistance can be performed with high accuracy. Thus, collision with the target can be avoided with more certainty. Therefore, the behavior of the own vehicle can be more appropriately predicted.

(3) In addition, according to the present embodiment, an example is described in which the driving assistance apparatus 10 performs driving assistance based on the course predicted from yaw rate and the like. The time constant for the low-pass filter process performed on the measurement values of the yaw rate and the like is adjusted based on the curvature of the expected traveling road.

However, the present invention is not limited to a driving assistance apparatus such as this. The present invention can be applied to an on-board apparatus that predicts the behavior of the own vehicle based on measurement values related to the state of the own vehicle and performs various processes based on the prediction results.

Specifically, the present invention can be applied, for example, in instances in which the behavior of the own vehicle is predicted based on acceleration in the front/back direction, lateral acceleration, and the like. The present invention can also be applied in instances in which abnormal behavior of the own vehicle, such as slipping and drifting, is predicted. Furthermore, in such instances, the time constant for the low-pass filter process may be adjusted based on other traveling conditions, such as the state of the surface of the road on which the own vehicle is traveling, in addition to the curvature of the expected traveling road of the own vehicle.

In addition, the present invention can be applied to an on-board apparatus that performs engine control, brake control, and the like, in addition to driving assistance. Even when the present invention is applied as such, the behavior of the own vehicle can be appropriately predicted in a manner similar to that according to the present embodiment.

(4) In addition, in the time constant adjusting process according to the present embodiment, the time constant for the low-pass filter process may be adjusted taking into consideration the direction of the curve of the expected traveling road.

In other words, at step S205 in the time constant adjusting process, the control section 13 may judge that the expected traveling road is a curve when the maximum value or the average value of the curvatures at the curvature determining points, or the like is a predetermined value or more. The control section 13 may then determine the direction of the curve from the shape of the expected traveling road.

Furthermore, at step S205, the control section 13 may, for example, detect the positions of the end sections on both sides of the expected traveling road using the peripheral object detecting section 11. The control section 13 may then identify the cruising lane of the own vehicle on the expected traveling road from the detection results. In addition, the control section 13 may, for example, identify the cruising lane of the own vehicle on the expected traveling road based on a destination of the driving assistance apparatus 10 or the like.

In addition, at step S210, when the curvature of the expected traveling road is a predetermined value or more (when the expected traveling road is a curve), the control section 13 may adjust the time constant of the low-pass filter taking into consideration the direction of the curve and the cruising lane of the own vehicle on the expected traveling road, in addition to the curvature.

Even when the same curving expected traveling road is traveled, the cruising lane in which the own vehicle travels differs depending on whether the expected traveling road is traveled as a right curve or a left curve. The curvature of the actual path on which the own vehicle travels may differ.

Therefore, as a result of the time constant being adjusted by taking into consideration the direction of the curve of the expected traveling road and the cruising lane of the own vehicle on the expected traveling road, the time constant can be more appropriately adjusted depending on the curvature of the actual traveling path of the own vehicle.

Correlation between terms used in the description of the above-described embodiment and terms used in the scope of claims are indicated below.

In the driving assistance starting process performed by the control section 13, the process of step S100 is equivalent to a process performed by the measuring means or unit. The process of step S105 is equivalent to a process performed by the filtering means or unit. The process of step S110 is equivalent to a process performed by the predicting means or unit. The processes of steps S120 to S130 are equivalent to processes performed by the executing means or unit.

In the time constant adjusting process performed by the control section 13, the processes of steps S200 and S205 are equivalent to processes performed by the detecting means. The process of step S210 is equivalent to a process performed by the adjusting means.

In the driving assistance apparatus 10 according to the present embodiment, the control section 13 functions as each of the above-described means by combination of hardware elements (CPU, ROM, RAM, I/O, and the like) and software elements (programs). Configurations of the hardware elements and the software elements are not particularly limited. Any configuration is possible as long as the control section 13 can function as the above-described means. For example, a single means (process) may be actualized by a single program. Alternatively, an n-number (n being a natural number of 2 or more) of means (processes) may be actualized by an n−1 number of programs or less (such as a single program). The respective numbers of hardware elements, such as the CPU, the ROM, the RAM, and the I/O are not particularly limited. One or a plurality of each hardware element may be provided as long as the control section 13 can function as the above-described means.

What is claimed is:

1. An on-board apparatus comprising:
   at least one of a yaw rate sensor and a steering angle sensor;
   a control unit, including a computer processor, configured to:
   periodically measure, as a state of an own vehicle, at least one of a yaw rate and a steering angle of the own vehicle;
   perform a low-pass filter process on the measurement results;
   predict a course of the own vehicle based on the measurement results on which the low-pass filter process has been performed;
   perform processes based on the predicted course of the own vehicle;
   detect, as a traveling environment of the own vehicle, a degree of curving of an expected traveling road on which the own vehicle is predicted to travel; and
   adjust a time constant for the low-pass filter process based on the degree of curving of the expected traveling road detected as the traveling environment of the own vehicle.

2. The on-board apparatus according to claim 1, wherein the control unit is further configured to adjust the time constant such that: when the degree of curving of the expected traveling road is large, the time constant is set to a low value; and when the degree of curving of the expected traveling road is small, the time constant is set to a high value.

3. The on-board apparatus according to claim 1, wherein the control unit is further configured to adjust the time constant such that; the larger the degree of curving of the expected traveling road is, the lower the time constant is; and the smaller the degree of curving of the expected traveling road is, the higher the time constant is.

4. A control method for an on-board apparatus, comprising the steps:

periodically measuring, as a state of an own vehicle, at least one of a yaw rate and a steering angle of the own vehicle;
performing a low-pass filter process on measurement results in the step of measuring;
predicting a course of the own vehicle based on the measurement results on which the low-pass filter process has been performed;
performing processes based on the course of the own vehicle predicted in the step of predicting;
detecting, as a traveling environment of the own vehicle, a degree of curving of an expected traveling road on which the own vehicle is predicted to travel; and
adjusting a time constant for the low-pass filter process based on the degree of curving of the expected traveling road detected as the traveling environment of the own vehicle in the step of detecting.

5. The control method according to claim 4, wherein
in the step of adjusting, the time constant is adjusted such that: when the degree of curving of the expected traveling road is large, the time constant is set to a low value; and when the degree of curving of the expected traveling road is small, the time constant is set to a high value.

6. The control method according to claim 4, wherein
in the step of adjusting, the time constant is adjusted such that: the larger the degree of curving of the expected traveling road is, the lower the time constant is; and the smaller the degree of curving of the expected traveling road is, the higher the time constant is.

* * * * *